(12) United States Patent
Kubota

(10) Patent No.: US 6,429,584 B2
(45) Date of Patent: Aug. 6, 2002

(54) ORGANIC ELECTROLUMINESCENCE DISPLAY PANEL AND METHOD OF MANUFACTURING THE SAME

(75) Inventor: Hirofumi Kubota, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/820,186

(22) Filed: Mar. 29, 2001

(30) Foreign Application Priority Data

Mar. 30, 2000 (JP) ........................................ 2000-094834

(51) Int. Cl.[7] .......................... H05B 33/22; H05B 33/14
(52) U.S. Cl. ...................... 313/504; 313/506; 313/512; 313/498; 313/500
(58) Field of Search ................................. 313/504, 505, 313/508–510, 506, 511, 512, 498, 500, 501

(56) References Cited

U.S. PATENT DOCUMENTS 5,962,970 A * 10/1999 Yokoi et al. ................ 313/505
6,099,746 A * 8/2000 Kim ............................ 216/24
6,137,220 A * 10/2000 Nagayama et al. ......... 313/504

FOREIGN PATENT DOCUMENTS

JP 09161969 A * 6/1997 ........... H05B/33/14

* cited by examiner

Primary Examiner—Nimeshkumar D. Patel
Assistant Examiner—Sikha Roy
(74) Attorney, Agent, or Firm—Sughrue Mion, PLLC

(57) ABSTRACT

An organic electroluminescence display panel includes a plurality of organic electroluminescence elements, each comprised of a first display electrode, one or more organic functional layers including a light emitting layer made of an organic compound, and a second display electrode, laminated in order on a substrate, and a plurality of ramparts disposed between the organic electroluminescence elements on the substrate and protruding from the substrate. The display panel further includes a sealing film for covering the organic electroluminescence elements and at least both side surfaces of the ramparts, and an inorganic passivation film made of an inorganic material for covering the sealing film. The sealing film includes a top surface having an inclined surface which is inclined at an inclination angle smaller than a right angle in a region extending from a top edge of each rampart to a center peak of an adjacent one of the electroluminescence elements.

18 Claims, 8 Drawing Sheets

ORGANIC ELECTROLUMINESCENCE DISPLAY PANEL AND METHOD OF MANUFACTURING THE SAME

BACKGROUND OF THE INVENTION

1. Field of the Invention

The present invention relates to an organic electroluminescence display panel which has a plurality of organic electroluminescence elements formed on a substrate in a predetermined pattern in which each organic electroluminescence element comprises one or more thin films of an organic compound material including a light emitting layer which exhibits the electroluminescence which emits light in response to a current injected thereinto (hereinafter also referred to as "EL"), and more particularly, to a method of fabricating the organic electroluminescence display panel.

2. Description of the Related Art

Generally, an organic EL element includes a transparent electrode as an anode, at least one organic compound thin film and a metal electrode as a cathode, which are laminated on a transparent substrate in due order. The organic compound thin film(hereinafter referred to as the "organic functional layer") may be a single light emitting layer, or a laminate which includes a three-layer structure composed of an organic hole transport layer, a light emitting layer and an organic electron transport layer, or a two-layer structure composed of an organic hole transport layer and a light emitting layer. The organic EL element may also include an electron or hole injection layer inserted between appropriate ones of these layers.

An organic EL display panel comprises a plurality of organic EL elements formed on a substrate in a predetermined pattern. For example, a matrix type display panel is disclosed in Japanese Unexamined Patent Publication No. Hei 8-102393. The disclosed full color display includes a light emitting device which has an image display array comprised of a plurality of light emitting pixels of organic EL elements arranged at respective intersections of intersecting rows and columns. For example, a matrix display type one is composed of row electrodes including transparent electrode layers, organic functional layers, and column electrodes including metal electrode layers which intersect the row electrodes. These layers are laminated in sequence. The row electrodes are each formed in a strip shape, and arranged in parallel with each other with a predetermined spacing therebetween. The same is applied as well to the column electrodes. In this way, the display panel of matrix display type has an image display array comprised of light emitting pixels which are formed of a plurality of organic EL elements positioned at respective intersections of a plurality of row electrodes with a plurality of column electrodes.

This organic EL display panel, when exposed to the atmosphere, suffers from a significant deterioration in characteristics due to moisture, particularly on the interface between the cathode layer and the organic functional layer of the organic EL elements, and when exposed to moisture in the air, undergoes a chemical change which results in ablation between the organic functional layer and the cathode to produce light emission disabled regions, i.e., so-called dark spots. As methods for solving this problem associated with moisture, structures for sealing simple organic EL element units have been proposed as disclosed in Japanese Unexamined Patent Publications Nos. Hei 8-111286, Hei 9-148066 and Hei 10-144468.

However, in the organic EL display panel comprised of the above-mentioned organic EL elements which requires ramparts between adjacent cathode lines, the use of the conventional sealing structure for organic EL element units gives rise to another problem that light emission disabled regions are produced near the ramparts.

OBJECT AND SUMMARY OF THE INVENTION

It is therefore an object of the present invention to provide an organic EL display panel which is less susceptible to the deterioration in the light emission characteristic due to moisture.

The present invention provides an organic electroluminescence display panel which comprises a plurality of organic electroluminescence elements each comprised of a first display electrode, one or more organic functional layers including a light emitting layer formed of an organic compound, and a second display electrode, laminated in order on a substrate; a plurality of ramparts disposed between the organic electroluminescence elements on the substrate and protruding from the substrate; a sealing film for covering the organic electroluminescence elements and at least both side surfaces of the ramparts; and an inorganic passivation film formed of an inorganic material for covering the sealing film, wherein the sealing film includes a top surface having an inclined surface which is inclined at an inclination smaller than a right angle in a region extending from a top edge of each rampart to a center peak of an adjacent one of the electroluminescence elements.

As to the organic electroluminescence display panel according to the invention, the panel further comprising an internal inorganic passivation film formed of an inorganic material disposed between said organic electroluminescence elements and said ramparts and said sealing film for covering said organic electroluminescence elements and said ramparts.

According to the invention, a method of manufacturing an organic electroluminescence display panel having a plurality of organic electroluminescence elements each having a first display electrode, one or more organic functional layers including a light emitting layer made of an organic compound, and a second display electrode, which are laminated in order on a substrate; a plurality of ramparts disposed between said organic electroluminescence elements on said substrate and protruding from said substrate, is characterized by comprising the steps of:

forming a sealing film for completely covering said organic electroluminescence elements and at least both side surfaces of said ramparts in such a manner that said sealing film includes a top surface having an inclined surface which is inclined at an inclination angle smaller than a right angle in a region extending from a top edge of each said rampart to a center peak of an adjacent one of said organic electroluminescence elements; and forming an inorganic passivation film made of an inorganic material on the sealing film for completely covering said sealing film.

As to the method of manufacturing an organic electroluminescence display panel according to invention, the method further comprises, a step of forming an internal inorganic passivation film formed of an inorganic material disposed between said organic electroluminescence elements and said ramparts and said sealing film for covering said organic electroluminescence elements and said ramparts, before forming the sealing film.

DETAILED DESCRIPTION OF THE PREFERRED EMBODIMENTS

In the following, embodiments of the present invention will be described with reference to the drawings.

Figure 1:
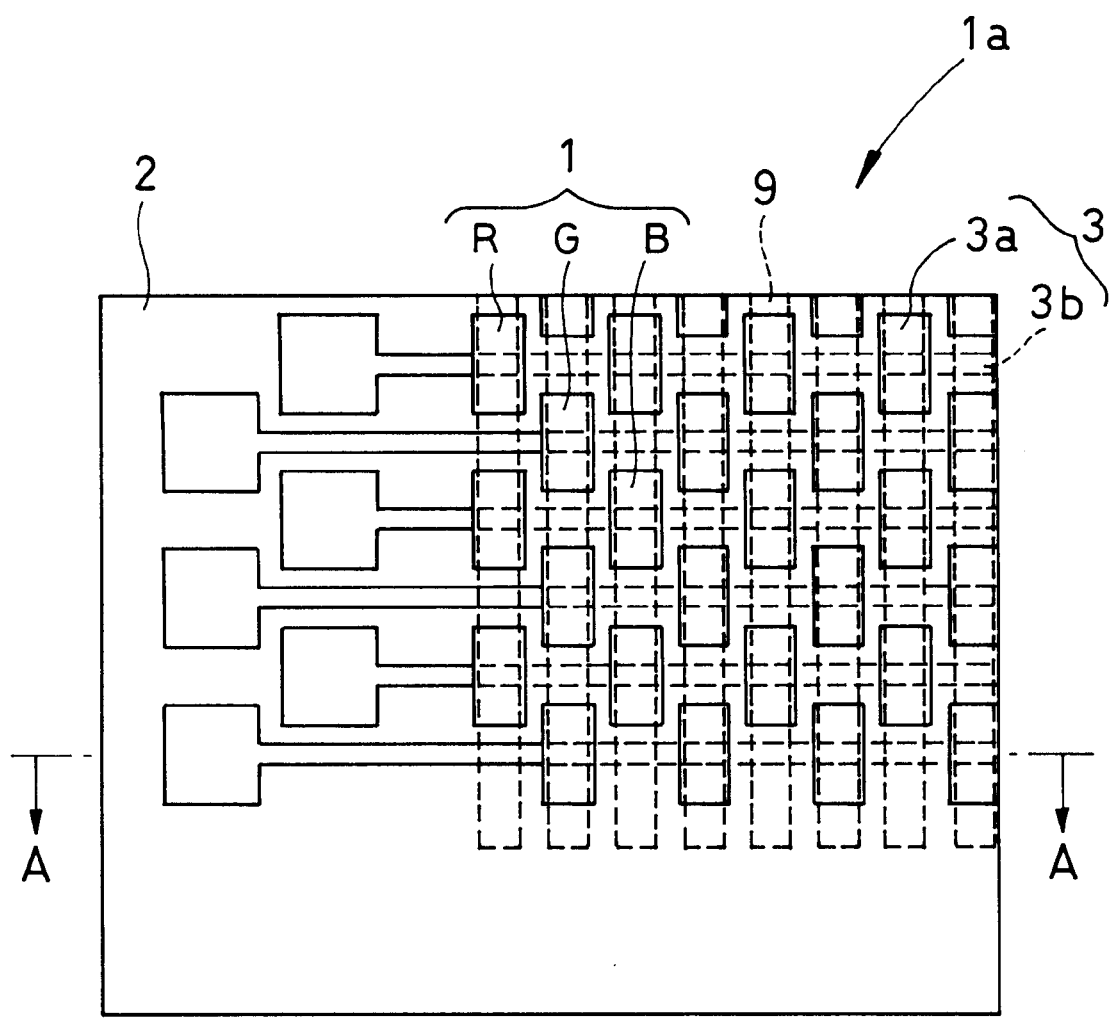
FIG. 1 is a partial enlarged front view generally illustrating an organic EL display panel according to the present invention.

FIG. 1 is a partial enlarged front view of an organic EL display panel according to a first embodiment, viewed through the panel from the front. As illustrated in FIG. 1, the organic EL display panel has an image display array region 1a comprised of a plurality of light emitting pixels 1 which are arranged in matrix on a transparent substrate 2 made of glass or the like, and each of which consists of light emitting portions for red R, green G and blue B. A light emitting portion, i.e., an organic EL element is formed at the position of a transparent electrode 3a at an intersection of a first display electrode line 3 in the horizontal direction, i.e., an anode, and a second display electrode line 9 in the vertical direction, i.e., a cathode. The first display electrode 3, i.e., the anode comprises a metal bus line 3b which electrically connects the insular transparent electrodes 3a in the horizontal direction. The organic EL display panel comprises a plurality of ramparts 7 disposed between the organic EL elements on the substrate 2.

Figure 2:
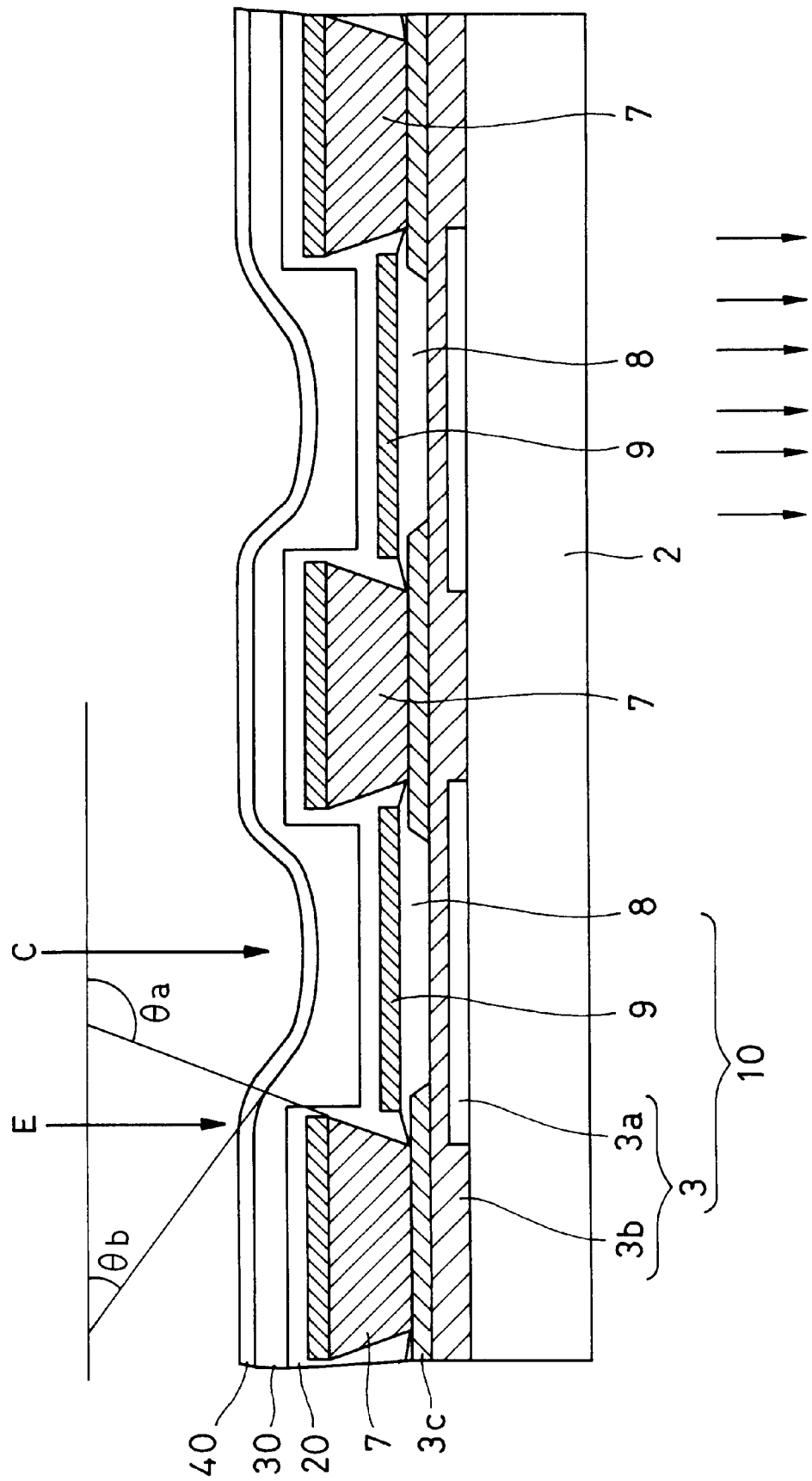
FIG. 2 is a partial cross-sectional view generally illustrating the organic EL display panel taken along the line AA in FIG. 1.

As illustrated in FIG. 2, each of the organic EL elements is comprised of a first display electrode line 3, one or more organic functional layers 8 including a light emitting layer made of an organic compound, and a second display electrode 9, laminated in order on a substrate 2. The ramparts 7 are disposed between the organic EL elements such that they protrude from the substrate. For example, each of the organic EL elements is fabricated by vapor depositing or sputtering an anode 3 as an optically transparent first display electrode made of indium tin oxide (ITO) on the transparent glass substrate 2. On the anode 3, a hole injection layer made of copper phtahlocyanine; a hole transport layer made of TPD (triphenylamine derivative); a light emitting layer made of Alq3 (aluminum chelate complex); and an electron injection layer made of $Li_2O$ (lithium oxide) are sequentially vapor deposited to form the organic functional layer 8. Further, on the organic functional layer 8, a cathode 9 made of aluminum (Al) is deposited by vapor deposition to oppose the electrode pattern of the anode 3 as a second display electrode. Optionally, the first display electrode line 3 may be covered with an insulating film 3c except for a pixel portion of the insular transparent electrode 3a.

The organic EL display panel further has an internal inorganic passivation film 20 which covers organic EL elements 10 and the ramparts 7; a sealing film 30 made of a resin for covering the internal inorganic passivation film 20; and an inorganic passivation film 40 made of an inorganic material for covering the sealing film 30. The internal inorganic passivation film 20 is made of a nitride such as silicon nitride, an oxide, or an inorganic material such as carbon. As a resin comprising the sealing film 30, a fluorine-based or silicon-based resin, or a synthetic resin such as photo resist, polyimide and so on may be used.

The top surface of the sealing film 30 has an inclined surface, in a region extending from the top edge E, of the rampart 7 toward a center peak C of the adjacent organic EL element, which is inclined at an inclination angle θb smaller than an inclination angle θa of the side surface of the rampart 7. The sealing film 30 has an inclined surface, in a region extending from a top edge of the rampart 7 toward a center peak of the adjacent organic EL element 10, in which the top surface of the sealing film is inclined at an inclination angle smaller than a right angle. With these inclined surfaces, uniform deposition of the inorganic passivation film 40 is achieved, so that a dense inorganic passivation film is provided.

For forming the inclined surfaces of the sealing film 30 as described, the following steps are performed. Without exposing the resultant organic EL elements to the atmosphere, the substrate 2 which carries the organic EL elements 10 and the ramparts 7 is transported into and placed in a plasma CVD (Chemical Vapor Deposition) chamber. Then, an internal inorganic passivation film 20 made of silicon nitride ($SiN_x$) (x is a molar ratio) is deposited on the surface of the organic EL elements 10 and the ramparts 7.

In this embodiment, only $SiH_4$ (silane) gas and $N_2$ (nitrogen) gas are used as source gases for use in the plasma CVD at flow rates of 10 sccm and 200 sccm, respectively. The RF power is set to 10 W; the temperature of the substrate to 100° C.; and the pressure in the chamber to 0.9 Torr. The resultant internal inorganic passivation film 20 has a thickness of about 2 μm. The thickness of the internal inorganic passivation film 20 is desirably 0.5 μm or more.

Next, a solution of resin having a predetermined viscosity is prepared, and coated on the organic EL elements and the ramparts to form a sealing film formed of the resin on the internal inorganic passivation film 20. For example, a fluorine-based or silicon-based resin is coated using an appropriate method such as spin coating, or immersion, i.e., dipping or the like to deposit the sealing film 30 in a thickness of 1 μm or more. As film deposition conditions, for example, the spin coating may involve determining the rotational speed of a spin coating machine such that the thickness of the film amounts to 1 μm or more, and subsequently evaporating a solvent with a hot plate, for example, at 80° C. for five minutes. Here, the spin coating includes a step of drying the sealing film made of the resin resulting from the coating. With this step, the sealing film 30 becomes thicker on the peaks C of the organic EL elements and thinner on the peaks E of the ramparts, i.e., the sealing film 30 has different thicknesses on the peaks C of the organic EL elements and on the peaks E of the ramparts. Alternatively, a general resist, polyimide and so on may also be used as the resin. The internal inorganic passivation film 20 acts, when a resin polymer is spin coated, to prevent its solvent from adversely affecting the organic functional layers of the organic EL elements.

Finally, on the same condition as those for the deposition of the internal inorganic passivation film 20, an external inorganic passivation film 40 is deposited, for example, in a thickness of 2 μm or more.

In an experiment, even after the organic EL display panel formed with the three-layer sealing structure for the organic EL elements and the ramparts had been left to stand for 500 hours at a room temperature and at a high temperature and a high humidity (60° C., 95%), respectively, the organic EL display panel did not experience any cracking or ablation in the sealing structure, and exhibited a stable light emitting operation as the organic EL display panel.

As described above, since there are provided with the internal inorganic passivation film 20 and the resin sealing film 30 deposited on the organic EL elements and the ramparts, and also with the external inorganic passivation film 40 deposited on the two films 20, 30, moisture is blocked by both the inorganic passivation films 20, 40.

Figure 3:
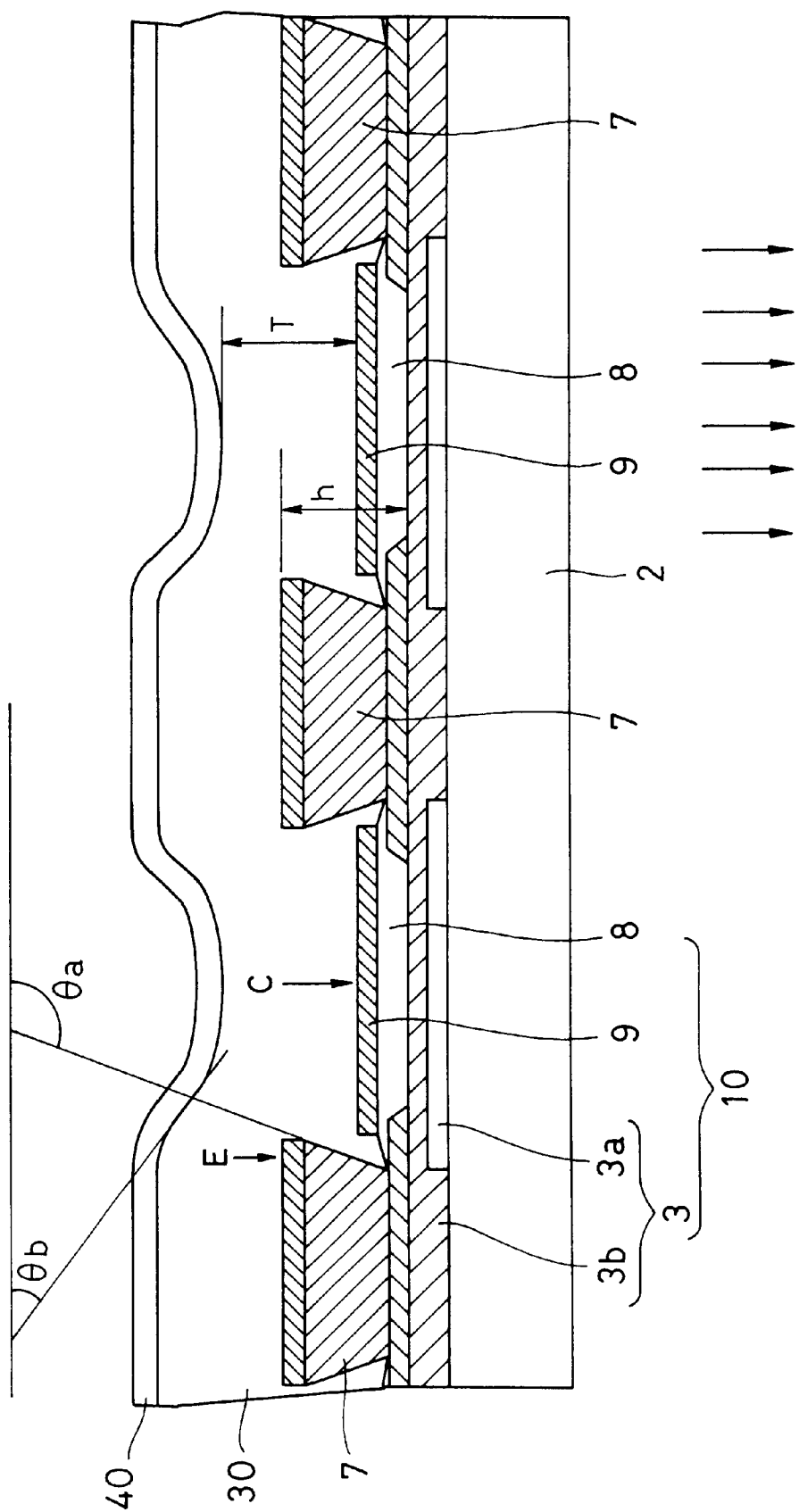
FIGS. 3 through 8 are partial cross-sectional views each generally illustrating an organic EL display panel according to another embodiment of the present invention.

FIG. 3 illustrates a cross-sectional view of a second embodiment of the present invention. In the first embodiment, the internal inorganic passivation film 20, the resin sealing film 30, and the external inorganic passivation film 40 are deposited in order on the organic EL elements 10, whereas in the second embodiment, the formation of the internal inorganic passivation film 20 is omitted. In other words, the second embodiment provides a two-layer sealing structure which omits the internal inorganic passivation film 20.

In the second embodiment, a vapor depositable organic material is used for the resin sealing film 30. For example, a resin such as poly-para-xylilene, polyethylene or the like may be used for the sealing film 30. The vapor depositable resin is vapor deposited by resistive heating in a vacuum atmosphere similar to that used for vapor depositing an EL material. For vapor deposition or the like, the resin is deposited in a thickness of 3 $\mu$m or more since it exceeds the height of the ramparts. Preferably, the sealing film 30 is formed to have a thickness T equal to or larger than the height h of the ramparts 7 on the organic EL elements.

After the vapor deposition of the sealing film, the sealing film is heated to the softening point of the resin. With this heating step, the organic materials such as a polymer film are heated to their melting temperatures or higher and solved, to bury side surfaces inclined at a large angle, such as the reverse-tapered ramparts 7.

Finally, on the same conditions as those for the deposition of the internal inorganic passivation film 20 in the first embodiment, an external inorganic passivation film 40 of silicon nitride is deposited, for example, in a thickness of 2 $\mu$m or more.

Even after the organic EL display panel formed with the two-layer sealing structure for the organic EL elements and the ramparts had been left to stand for 500 hours at a room temperature and at a high temperature and a high humidity (60° C., 95%), respectively, the organic EL display panel did not experience any cracking or ablation in the sealing structure, and exhibited a stable light emitting operation as the organic EL display panel.

As a comparative example, only a silicon nitride film of 3 $\mu$m thick is deposited on a plurality of organic EL elements 10 and ramparts 7 formed on a substrate 2 by plasma CVD on the same condition as in the foregoing embodiments to fabricate an organic EL display panel.

As a result, it has been found that the existence of the ramparts causes the silicon nitride film on the side surfaces of the ramparts to be more permeable to $H_2O$ and $O_2$.

In an experiment, a SiNx film was deposited on cathode ramparts, and immersed in buffered fluoric acid for etching, and the etching rate was examined in regions irradiated with a plasma and regions not irradiated with the plasma (both side surfaces of reverse-tapered ramparts). It was found that the etching rate was higher in the region not irradiated with the plasma. It is therefore presumed that the ramparts, particularly, regions kept from irradiation of a plasma by the overhung side surfaces, are more permeable to moisture and oxygen. According to the present invention, the sealing film made of a resin is deposited to provide a smooth top surface thereof, with the inorganic passivation film additionally deposited thereon, thereby preventing formation of regions kept from the irradiation of a plasma by the ramparts. In a region extending from the top edge of a rampart to the center peak of the adjacent organic EL element, the sealing film is formed such that the top surface thereof has an inclined surface which is inclined at an inclination angle smaller than a right angle, so that the inorganic passivation film deposited thereon is free from abrupt slopes and therefore is slowly inclined on both side surfaces of the ramparts.

Figure 4:
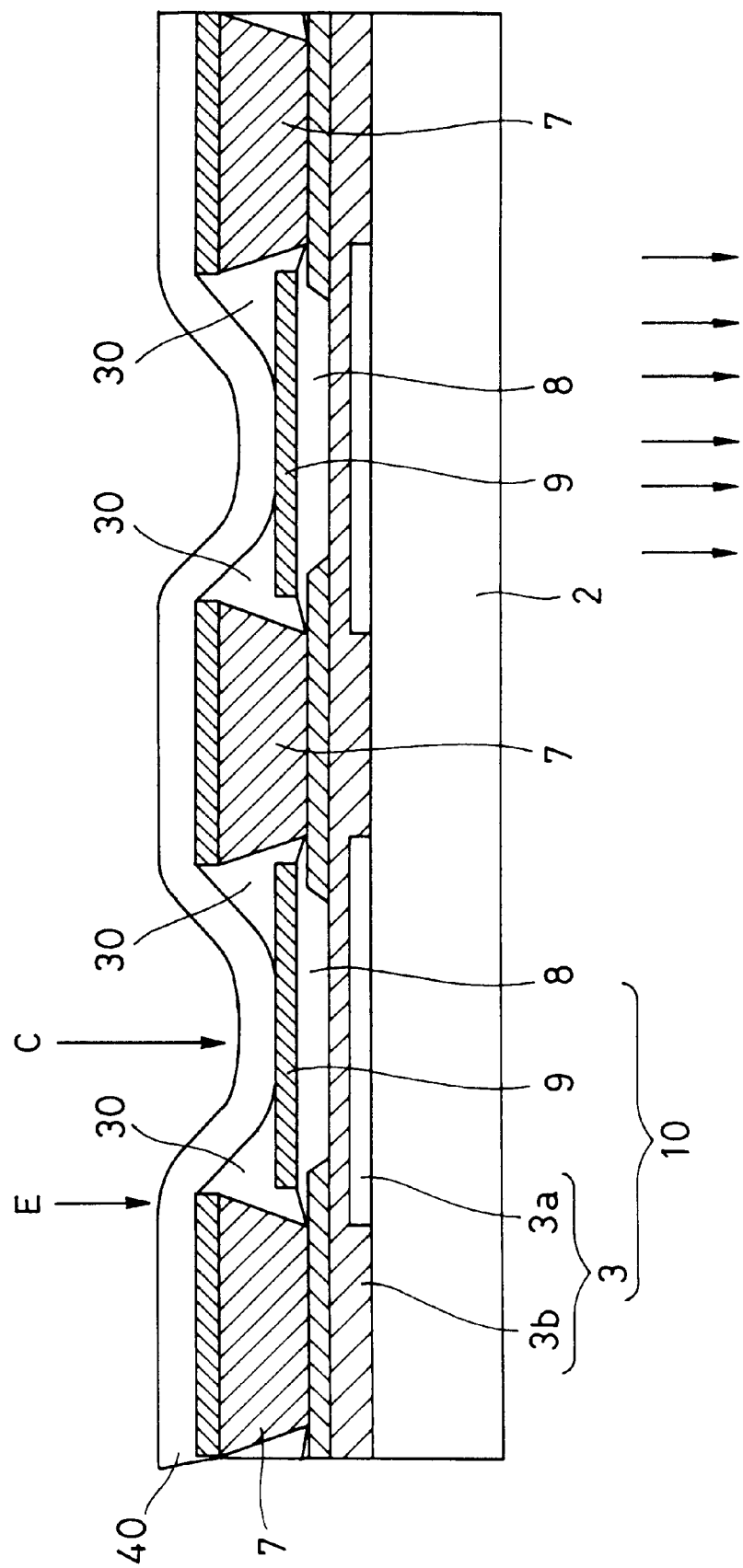
Figure 5:
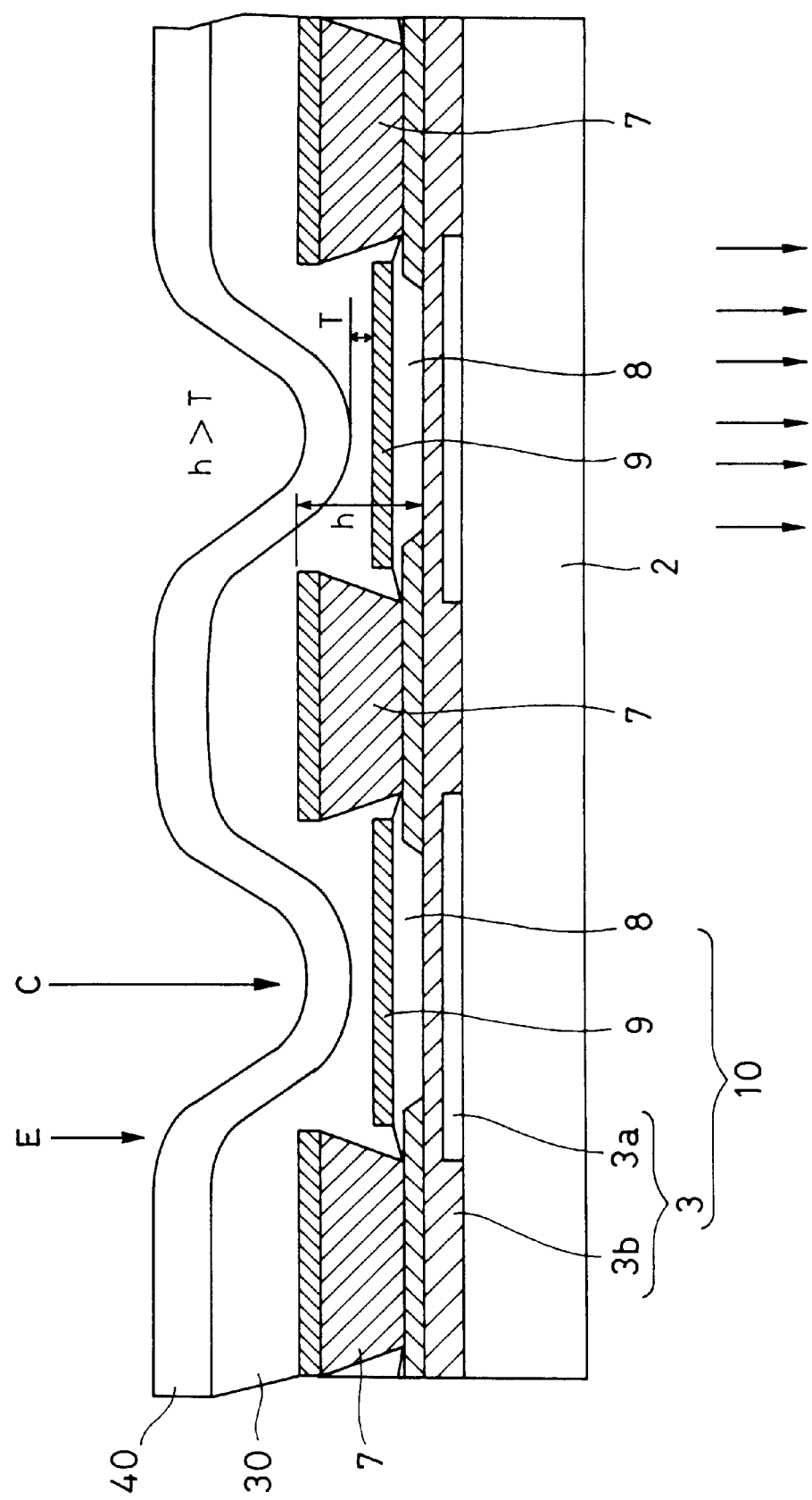

Thus, as illustrated in FIG. 4, the sealing film 30 may be deposited such that the top surface thereof is inclined at an inclination angle smaller than a right angle in order for the sealing film 30 to cover at least both side surfaces of the ramparts. Alternatively, as illustrated in FIG. 5, the sealing film 30 may be formed such that its thickness is equal to or smaller than the height of the ramparts 7.

Figure 6:
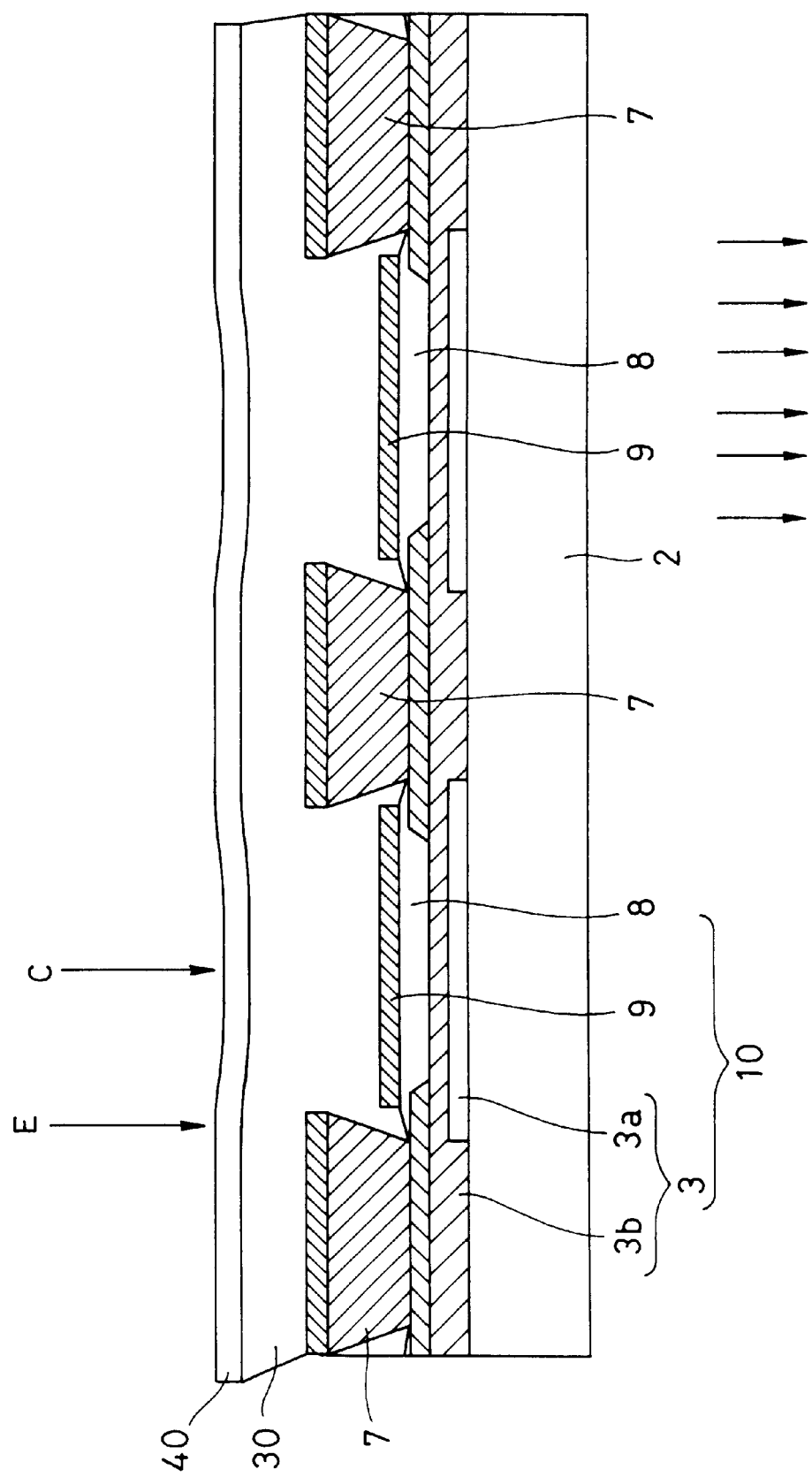
Figure 7:
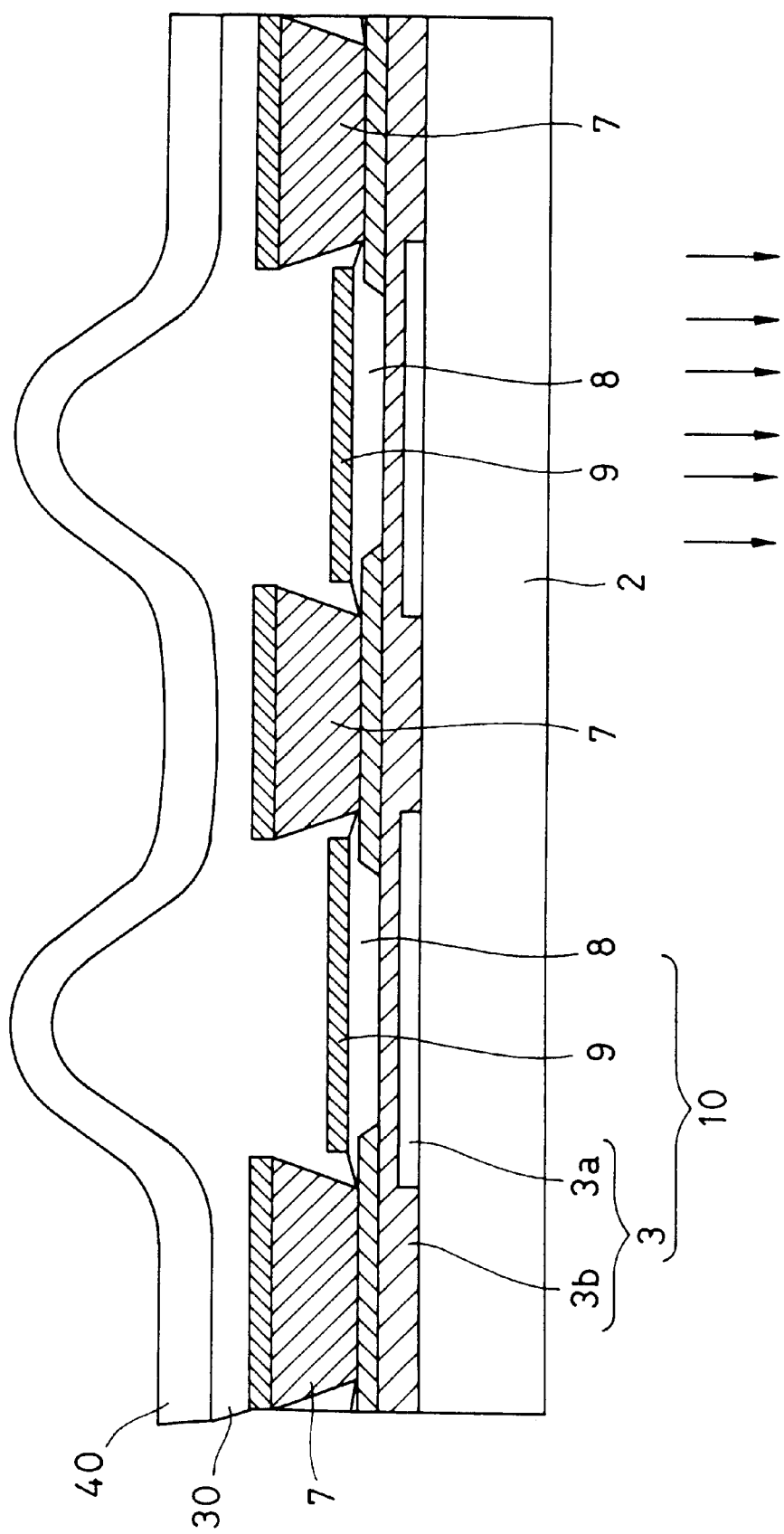

Furthermore, as illustrated in FIG. 6, the sealing film 30, which covers both side surfaces of the ramparts 7 at least from the top edges of the ramparts, may of course be formed uniformly such that its top surface has an inclination equal to zero, i.e., such that its top surface smoothly extends substantially in the horizontal direction. It should be noted that even if the sealing film 30 has ruggedness on the top surface as illustrated in FIG. 7, the sealing film 30 may be formed such that its thickness on the organic EL elements 10 exceeds its thickness on the ramparts 7, as long as the top surface is inclined at an angle less than a right angle.

In the foregoing embodiments, a silicon nitride film formed by plasma CVD is used as the inorganic passivation film for blocking moisture. The present invention, however, is not limited to this particular material, but any inorganic passivation film, formed by a vapor phase growth method such as sputtering, vacuum vapor deposition or the like, may be employed for the present invention as long as it exhibits a high moisture impermeability. For example, $SiO_2$, $Al_2O_3$, DLC (diamond-like carbon), and so on may be employed.

Further, in the foregoing embodiments, a description have been made for an organic EL display panel of simple matrix display type which includes the organic functional layer 8, i.e., light emitting portions at intersections of a plurality of anodes 3 and cathodes 9 on the transparent substrate 2 as illustrated in FIG. 1, but the present invention can be applied to a panel of active matrix display type.

An organic EL display panel of a third embodiment in accordance with the active matrix driving scheme comprises scanning signal lines and data signal lines substituted for the anodes and cathodes in the panel of simple matrix display type, a thin film transistor (TFT) as a switching element at each of intersections of the scanning signal lines with the data signal lines, and supplies each pixel with a current through switching to illuminate organic EL elements. Semiconductor devices formed of p-Si, a-Si, or a metal oxide film semiconductor field effect transistor, i.e., so-called MOSFET may be employed for TFTs, Manufacturing steps will be generally described for a display panel of an organic EL element display device in accordance with the active matrix driving scheme illustrated in FIG. 8.

(1) ITO anodes of first display electrodes, and a variety of lines such as scanning signal lines, common anode lines, bus lines and so on are formed on a transparent substrate, and an insulating layer of an insulating material is deposited thereon. The insulating layer has openings for exposing the transparent electrodes to laminate organic material layers including an organic electroluminescence material layer in a later step.

(2) TFTs for addressing, TFTs for driving, data signal lines, and so on are formed.

(3) Barriers are formed for partitioning into respective light emitting portions, and only drains of FET for driving and anodes are exposed. While the ramparts have openings for exposing the transparent electrodes, the ramparts cover the TFTs for addressing and driving, and the data signal lines except for contact holes. While the ramparts are not reverse-tapered but tapered, i.e., has a trapezoidal or rectangular cross section unlike those in the aforementioned embodiments, the ramparts are formed higher than the TFTs, so that their side walls are not necessarily smooth and may partially include ruggedness on the side walls.

(4) Each of the organic material layers is deposited on the anodes through the ramparts as openings.

(5) Metal electrodes (cathodes) for second display electrodes are deposited on the organic EL material layers and connected to drains of the TFTs.

Figure 8:
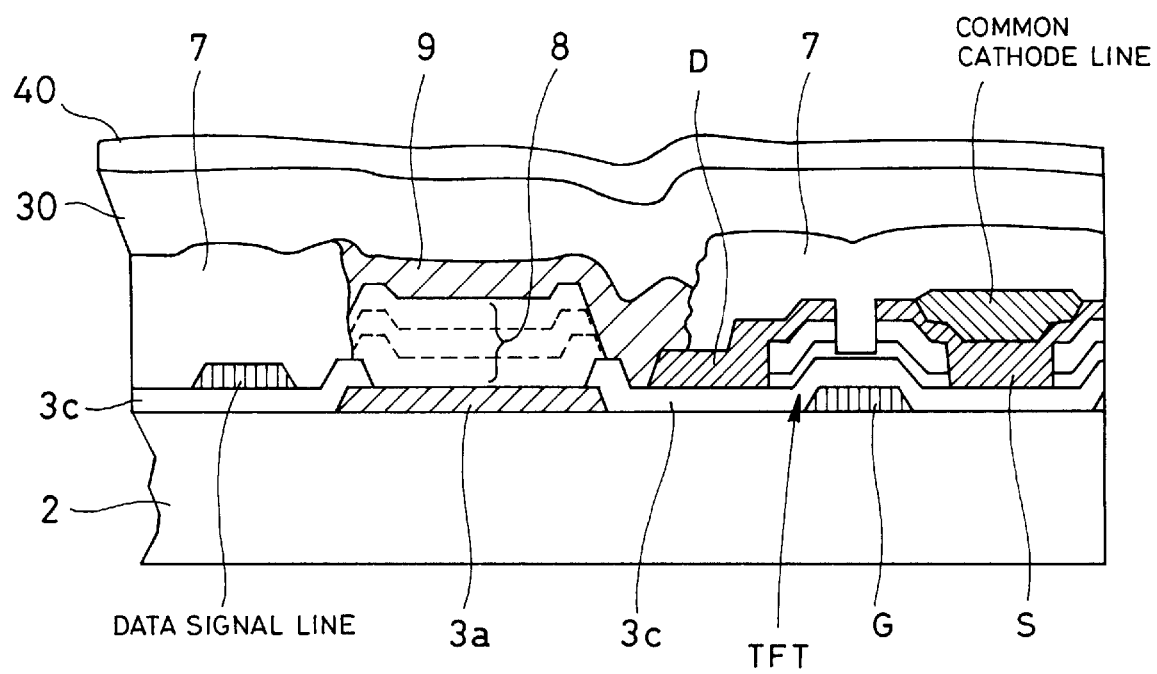

(6) An internal inorganic passivation film is deposited on the organic EL elements, metal electrodes and ramparts, and a resin sealing film is coated thereon. Alternatively, as illustrated in FIG. 8, the internal inorganic passivation film is omitted, and a sealing film 30 made of a vapor depositable resin is deposited and heated. Finally, an inorganic passivation film 40 is deposited for sealing.

According to the present invention, a sealing structure can be formed for fully blocking moisture and oxygen, thereby making it possible to provide a highly reliable organic EL display.

What is claimed is:

1. An organic electroluminescence display panel comprising:
    a plurality of organic electroluminescence elements each comprised of a first display electrode, one or more organic functional layers including a light emitting layer made of an organic compound, and a second display electrode, laminated in order on a substrate;
    a plurality of ramparts disposed between said organic electroluminescence elements on said substrate and protruding from said substrate;
    a sealing film for covering said organic electroluminescence elements and at least both side surfaces of said ramparts; and
    an inorganic passivation film made of an inorganic material for covering said sealing film,
    wherein said sealing film includes a top surface having an inclined surface which is inclined at an inclination angle smaller than a right angle in a region extending from a top edge of each said rampart to a center peak of an adjacent one of said organic electroluminescence elements.

2. The organic electroluminescence display panel according to claim 1, wherein said sealing film has different thicknesses at peaks of said organic electroluminescence elements and at peaks of said ramparts.

3. The organic electroluminescence display panel according to claim 1, wherein said sealing film is formed in a thickness equal to or larger than a height of said ramparts.

4. The organic electroluminescence display panel according to claim 1, wherein said sealing film is made of a resin.

5. The organic electroluminescence display panel according to claim 1, further comprising an internal inorganic passivation film made of an inorganic material disposed between said organic electroluminescence elements and said ramparts and said sealing film for covering said organic electroluminescence elements and said ramparts.

6. The organic electroluminescence display panel according to claim 1, wherein said inorganic passivation film is made of a nitride, an oxide or carbon.

7. The organic electroluminescence display panel according to claim 6, wherein said inorganic passivation film is made of silicon nitride.

8. A method of manufacturing an organic electroluminescence display panel having a plurality of organic electroluminescence elements each having a first display electrode, one or more organic functional layers including a light emitting layer made of an organic compound, and a second display electrode, which are laminated in order on a substrate; a plurality of ramparts disposed between said organic electroluminescence elements on said substrate and protruding from said substrate, comprising the steps of:
    forming a sealing film for covering said organic electroluminescence elements and at least both side surfaces of said ramparts in such a manner that said sealing film includes a top surface having an inclined surface which is inclined at an inclination angle smaller than a right angle in a region extending from a top edge of each said rampart to a center peak of an adjacent one of said organic electroluminescence elements; and
    forming an inorganic passivation film made of an inorganic material on the sealing film for completely covering said sealing film.

9. A method of manufacturing an organic electroluminescence display panel according to claim 8, wherein, in the step of forming the sealing film, said sealing film is made of a resin, and said sealing film is formed in a thickness equal to or larger than a height of said ramparts by vacuum vapor deposition.

10. A method of manufacturing an organic electroluminescence display panel according to claim 9, wherein, in the step of forming the sealing film, the vapor deposited sealing film is heated to a softening point of the resin.

11. A method of manufacturing an organic electroluminescence display panel according to claim 9, further comprising, a step of forming an internal inorganic passivation film made of an inorganic material disposed between said organic electroluminescence elements and said ramparts and said sealing film for covering said organic electroluminescence elements and said ramparts, before forming the sealing film.

12. A method of manufacturing an organic electroluminescence display panel according to claim 11, wherein in the step of forming the sealing film, the internal inorganic passivation film is coated with a resin solution to form a resin sealing film.

13. A method of manufacturing an organic electroluminescence display panel according to claim 12, wherein in the step of forming the sealing film, the coated resin sealing film is dried.

14. A method of manufacturing an organic electroluminescence display panel according to claim 12, wherein in the step of forming the sealing film, the coated resin sealing film is formed by using a spin coating or immersion method.

15. A method of manufacturing an organic electroluminescence display panel according to claim 8, wherein in the step of forming the sealing film, the inorganic passivation film is formed by using a vacuum vapor deposition method.

16. A method of manufacturing an organic electroluminescence display panel according to claim 8, wherein in the step of forming the sealing film, the inorganic passivation film is formed by using a sputtering method.

17. A method of manufacturing an organic electroluminescence display panel according to claim 8, wherein in the step of forming the sealing film, the inorganic passivation film is formed by using a chemical or physical vapor deposition method.

18. A method of manufacturing an organic electroluminescence display panel according to claim 8, wherein in the step of forming the sealing film, the inorganic passivation film is formed by using a plasma CVD method.

* * * * *